United States Patent
Engberg et al.

(10) Patent No.: US 9,797,942 B2
(45) Date of Patent: Oct. 24, 2017

(54) RADIOMETRIC TEST AND CONFIGURATION OF AN INFRARED FOCAL PLANE ARRAY AT WAFER PROBE

(71) Applicant: Seek Thermal, Inc., Santa Barbara, CA (US)

(72) Inventors: Andreas Engberg, Santa Barbara, CA (US); William J. Parrish, San Barbara, CA (US)

(73) Assignee: Seek Thermal, Inc., Santa Barbara, CA (US)

( * ) Notice: Subject to any disclaimer, the term of this patent is extended or adjusted under 35 U.S.C. 154(b) by 232 days.

(21) Appl. No.: 14/838,048

(22) Filed: Aug. 27, 2015

(65) Prior Publication Data
US 2016/0061883 A1    Mar. 3, 2016

Related U.S. Application Data

(60) Provisional application No. 62/043,020, filed on Aug. 28, 2014.

(51) Int. Cl.
| | |
|---|---|
| G01R 31/265 | (2006.01) |
| G01J 1/08 | (2006.01) |
| G01J 5/52 | (2006.01) |
| G01R 31/28 | (2006.01) |
| G01J 5/02 | (2006.01) |

(Continued)

(52) U.S. Cl.
CPC ........... *G01R 31/2656* (2013.01); *G01J 1/08* (2013.01); *G01J 5/02* (2013.01); *G01J 5/522* (2013.01); *G01R 31/2832* (2013.01); *G01J 5/20* (2013.01); *G01J 2005/0048* (2013.01);

(Continued)

(58) Field of Classification Search
None
See application file for complete search history.

(56) References Cited

U.S. PATENT DOCUMENTS

| | | | |
|---|---|---|---|
| 5,471,055 A | 11/1995 | Costanzo et al. | |
| 5,532,484 A * | 7/1996 | Sweetser | H04N 5/367 250/332 |

(Continued)

OTHER PUBLICATIONS

Automatic Test System for Wafer Level Probing Photodiode of Optical and Electrical Parameters of Array Dies http://ieeexplore.ieee.org/xpl/login.jsp?tp=&arnumber=4179167&url=http%3A%2F%2Fieeexpl ore.ieee.org%2Fiel5%2F4143535%2F4179079%2F04179167.pdf%3Farnumber%3D4179167.

(Continued)

*Primary Examiner* — Melissa Koval
*Assistant Examiner* — Nasima Monsur
(74) *Attorney, Agent, or Firm* — Knobbe Martens Olson & Bear LLP (57) ABSTRACT

FPAs on a wafer can be tested prior to dicing the wafer into individual dies. A focal plane array (FPA) can comprise an array of photodetectors, such as microbolometers, on a semiconductor substrate or die. FPAs can be manufactured on a wafer to make multiple FPAs on a single wafer that can be later diced or divided into individual FPAs. Prior to dicing the wafer, the FPAs can be tested electrically and radiometrically in bulk to characterize individual FPAs, to identify bad pixels, to identify bad chips, to calibrate individual FPAs, and the like. These test results can be used to determine acceptable FPAs and can be used to provide initial settings for imaging systems with the tested and integrated FPA.

16 Claims, 6 Drawing Sheets

(51) Int. Cl.
   *G01R 31/3185* (2006.01)
   *G01J 5/20* (2006.01)
   *G01J 5/00* (2006.01)
   *G01J 5/06* (2006.01)

(52) U.S. Cl.
   CPC . *G01J 2005/0077* (2013.01); *G01J 2005/068* (2013.01); *G01R 31/318511* (2013.01)

(56) References Cited

U.S. PATENT DOCUMENTS

| | | | |
|---|---|---|---|
| 5,811,808 | A | 11/1998 | Cannata et al. |
| 2002/0177330 | A1 | 11/2002 | Haffenden |
| 2004/0041911 | A1 | 3/2004 | Odagiri |
| 2004/0200961 | A1* | 10/2004 | Parrish ............... G01J 5/02 250/338.1 |
| 2008/0136434 | A1* | 6/2008 | Lu ................. H04N 17/002 324/750.16 |
| 2008/0210872 | A1 | 9/2008 | Grimberg |
| 2011/0043233 | A1* | 2/2011 | Arkin ............... G01R 31/2889 324/755.03 |
| 2011/0299846 | A1 | 12/2011 | Weisbach |
| 2012/0312976 | A1 | 12/2012 | Boulanger et al. |
| 2013/0178245 | A1 | 7/2013 | Kulas |
| 2013/0218500 | A1* | 8/2013 | Durand ............... G01J 5/24 702/87 |
| 2014/0240689 | A1 | 8/2014 | Arbouzov |
| 2014/0300809 | A1 | 10/2014 | Oliveira |
| 2015/0177313 | A1 | 6/2015 | Hoelter et al. |

OTHER PUBLICATIONS

Customized Wafer Probing Solutions.
Test Results of a "Factory" Calibration Technique for Non-Uniformity Correction of an InSb Infrared System.
Automated Radiometric Cryoprobe of IRFPA Wafers.
Suss Report—Issue Feb. 2009—www.suss.com.

* cited by examiner

TOP VIEW

HOT LOCATION

FIG. 2B

COLD LOCATION

FIG. 2C

PATTERN LOCATION

RADIOMETRIC TEST AND CONFIGURATION OF AN INFRARED FOCAL PLANE ARRAY AT WAFER PROBE

CROSS-REFERENCE TO RELATED APPLICATIONS

This application claims the benefit of priority from U.S. Prov. App'n No. 62/043,020, filed Aug. 28, 2014, entitled "Radiometric Test and Configuration of an Infrared Focal Plane Array at Wafer Probe," which is incorporated by reference herein in its entirety.

BACKGROUND

Field

The present disclosure generally relates to wafer probers and in particular to testing of focal plane array wafers before the wafers are diced.

Description of Related Art

The increasing availability of high-performance, low-cost uncooled thermal imaging devices, such as bolometer focal plane arrays (FPAs), is enabling the design and production of mass-produced, consumer-oriented infrared (IR) cameras capable of quality thermal imaging. Such thermal imaging sensors have long been expensive and difficult to produce, thus limiting the employment of high-performance, long-wave imaging to high-value instruments, such as aerospace, military, or large-scale commercial applications. Mass-produced thermal cameras may have different design requirements than complex military or industrial systems. New approaches for radiometrically testing infrared focal plane arrays may provide cost-effective methods for producing high-quality and low-cost thermal cameras.

SUMMARY

Example embodiments described herein have innovative features, no single one of which is indispensable or solely responsible for their desirable attributes. Without limiting the scope of the claims, some of the advantageous features will now be summarized.

A focal plane array (FPA) can comprise an array of photodetectors, such as microbolometers, on a semiconductor substrate or die. FPAs can be manufactured using various techniques to deposit components on a semiconductor substrate, thereby making multiple FPAs on a single wafer that can be later diced or divided into individual FPAs, Prior to dicing the wafer, many or all of the FPAs on a wafer can be tested electrically and radiometrically to characterize individual FPAs, to identify bad pixels, to identify bad chips, to calibrate individual FPAs, and the like. These test results can be used to determine acceptable FPAs, classify FPA performance, and can be used to provide initial settings for imaging systems incorporating the tested FPA, all before the wafers are diced. Herein disclosed are systems and methods for testing FPAs prior to dicing.

In a first aspect, a method is provided for simultaneously testing a plurality of focal plane arrays on a wafer, each focal plane array on a die on the wafer. The method includes applying electrical voltages to a plurality of dies simultaneously using a probe card having a plurality of sets of probes, individual sets of probes configured to electrically couple to electrical pads on corresponding individual dies on the wafer. The method includes applying electrical voltages to the dies and measuring corresponding electrical voltages to determine the existence of electrical shorts within the die. The method includes controlling components on the plurality of focal plane arrays to have a plurality of tailored values, components of individual focal plane arrays including an adjustable global resistor and adjustable resistor networks. The method includes exposing pixels within the plurality of focal plane arrays to infrared radiation. The method includes acquiring measurements of pixel responses and adjusting a resistance of at least one of the adjustable global resistor or the adjustable resistor networks to achieve a targeted response for the pixels. The method includes generating a pixel quality table indicating pixels that are flagged as good pixels and pixels that are flagged as bad pixels. The method includes storing initial adjustment settings for use by an imaging system incorporating one of the plurality of tested focal plane arrays, the initial adjustment settings comprising the adjusted resistance of the adjustable global resistor or the adjustable resistor networks.

In some embodiments of the first aspect, the method further includes generating a gain table for pixels in an individual focal plane array based at least in part on the acquired measurements. In some embodiments of the first aspect, exposing pixels to infrared radiation includes exposing pixels to an infrared emitter at a first temperature, and exposing pixels to an infrared emitter at a second temperature, hotter than the first temperature.

In some embodiments of the first aspect, the pixel quality table and the determined initial settings are saved to a results data store. In a further embodiment, a thermal imaging system integrating a tested focal plane array die is configured to retrieve the pixel quality table and the determined initial settings from the results data store.

In some embodiments of the first aspect, the method also includes configuring a plurality of fuses on an individual die to encode a die identification. In a further embodiment, the pixel quality table or the determined initial settings for an individual focal plane array are stored in a results data store using the die identification to identify the pixel quality table or the determined initial settings associated with the individual focal plane array.

In some embodiments of the first aspect, a tested focal plane array that has been determined to pass performance criteria is suitable for integration in a thermal imager without further testing. In some embodiments of the first aspect, the method further includes classifying a tested focal plane array based on the acquired measurements and the generated pixel quality table. In some embodiments of the first aspect, the method further includes using the acquired measurements and the generated pixel quality table to provide feedback for a wafer manufacturing process. In some embodiments of the first aspect, the method further includes performing a basic communication test with an individual die being tested. In some embodiments of the first aspect, the method further includes performing a bolometer test configured to sample a particular bolometer on a tested die, wherein the sampled data from the particular bolometer is used as an indication of wafer quality. In some embodiments of the first aspect, the method further includes balancing resistor network values so that columns within an individual focal plane array are substantially balanced. In some embodiments of the first aspect, the method further includes testing reference columns of an individual focal plane array to determine a subset of reference columns that are suitable for use during operation as part of a thermal imaging system.

In a second aspect, a method is provided for simultaneously testing a plurality of focal plane arrays on a wafer, each focal plane array comprising a global resistor. The method includes exposing pixels of the plurality of focal plane arrays to an infrared emitter at a first temperature. The method includes exposing the pixels to an infrared emitter at a second temperature hotter than the first temperature. The method includes setting one or more of individual global resistors and resistor networks to have a plurality of global resistance values. The method includes acquiring measurements of the pixels at the first and second temperatures and at the plurality of resistance values. The method includes determining calibration data for individual resistors associated with individual tested focal plane arrays. The calibration data includes a default command word, a table of resistance values for resistor networks on the focal plane array, a table of voltages, and a gain table for pixels with bad pixels marked as having a gain value of zero.

In some embodiments of the second aspect, a tested focal plane array is integrated into a thermal imaging system having a controller, wherein the controller is configured to read the calibration data to set the initial resistor values for the tested focal plane array in the thermal imaging system. In some embodiments of the second aspect, a tested focal plane array is integrated into a thermal imaging system having a system memory, wherein the system memory includes the calibration data for the tested focal plane array in the thermal camera.

In a third aspect, a method is provided for simultaneously testing a plurality of focal plane arrays on a wafer, each focal plane array on a die on the wafer. The method includes configuring a plurality of fuses on an individual die to encode a die identification. The method includes acquiring measurements of individual sample bolometers on individual dies using targeted input signals. The method includes determining a quality of the wafer based on the measurements of the sample bolometers. The method includes determining initial settings for an imaging system incorporating one of the plurality of tested focal plane arrays. The method includes storing the initial settings in a results data store using the die identification to identify the determined initial settings associated with the individual focal plane array.

In some embodiments of the third aspect, a tested focal plane array is integrated into a thermal imaging system having a system controller, wherein the system controller is configured to retrieve the calibration data based on the die identification read from the die by the system controller. In some embodiments of the third aspect, the testing can be performed at a plurality of ambient temperatures.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

DETAILED DESCRIPTION

Generally described, aspects of the present disclosure relate to simultaneous or parallel testing of multiple focal plane arrays on a wafer. The multiple die testing can be configured to characterize individual FPAs and individual photodetectors or pixels within an individual FPA. The testing can include both electrical and radiometric tests to characterize the FPAs. The present disclosure includes systems and methods to perform testing during the manufacturing process, prior to dicing the wafer to generate the individual FPAs. To perform these tests, the systems and methods disclosed herein can use wafer probes. The systems and methods can save the test results using unique identifiers associated with individual FPAs that can be used when the FPAs are installed in an imaging system, such as a thermal imager. Advantageously, this can increase the speed and efficiency of testing and characterizing FPAs. This can also advantageously provide feedback for the manufacturing system to potentially determine inefficiencies or problems in the manufacturing process.

Although examples and implementations described herein focus, for the purpose of illustration, on focal plane arrays with microbolometers for use in a thermal imaging core, the systems and methods disclosed herein can be used with other types of thermal imaging sensor arrays as well as visible imaging sensors such as charge coupled devices (CCDs) and complementary metal oxide semiconductor (CMOS) sensors that are fabricated on wafers and packaged (e.g., integrated with readout circuits and/or other components) at the wafer level. Various aspects of the disclosure will now be described with regard to certain examples and embodiments, which are intended to illustrate but not limit the disclosure.

Typically, a time- and resource-intensive operation during production of thermal imaging cameras utilizing infrared FPAs is calibration and testing of the FPA. For example, it is not uncommon for FPAs to spend hours in a temperature-controlled environment. A series of tests, e.g., radiometric tests and/or electrical tests, may be performed at multiple controlled ambient temperatures. Thus, a significant time savings may be achieved if radiometric and electrical tests can be performed simultaneously, in parallel or on multiple die at once before a wafer of FPAs is diced. Time and cost savings may be achieved where, as disclosed herein, a wafer having multiple FPAs is tested radiometrically and electrically in at the wafer level, effectively spreading the hours of temperature cycling and testing across many FPAs at once. Further savings in time and cost can be achieved by utilizing the acquired test data during integration of the FPAs with an imaging system. These tests and test systems, therefore, may be particularly advantageous for mass-produced thermal imaging cameras.

In general, wafer-level testing may be performed using wafer probers. For imaging sensor devices, wafer-level testing may include illuminating the imaging sensor devices with radiation of varying intensities and/or wavelengths. In various embodiments disclosed herein, one or more illumination sources and associated electronics may be used with a wafer prober to provide illumination (e.g., visible and/or non-visible electromagnetic radiation) to dies on a wafer to perform testing, calibration, and/or inspection of devices on the wafer. Such illumination provided by various embodiments of the illuminator may permit the wafer prober to perform testing, calibration, and/or inspection of image sensors that may have been fabricated and/or packaged on a wafer. A probe card can be implemented with the wafer prober to provide a structure for the illumination sources and/or to provide electrical probes configured to couple to corresponding pads on dies on the wafer. The probe card can be configured to test a plurality of dies simultaneously or in rapid succession. For die where the contact pads are on the detector side of the die, the probe card can include an aperture configured to allow the illumination to reach the dies as well as to provide a path for electrical probes to reach the dies.

Figure 1:
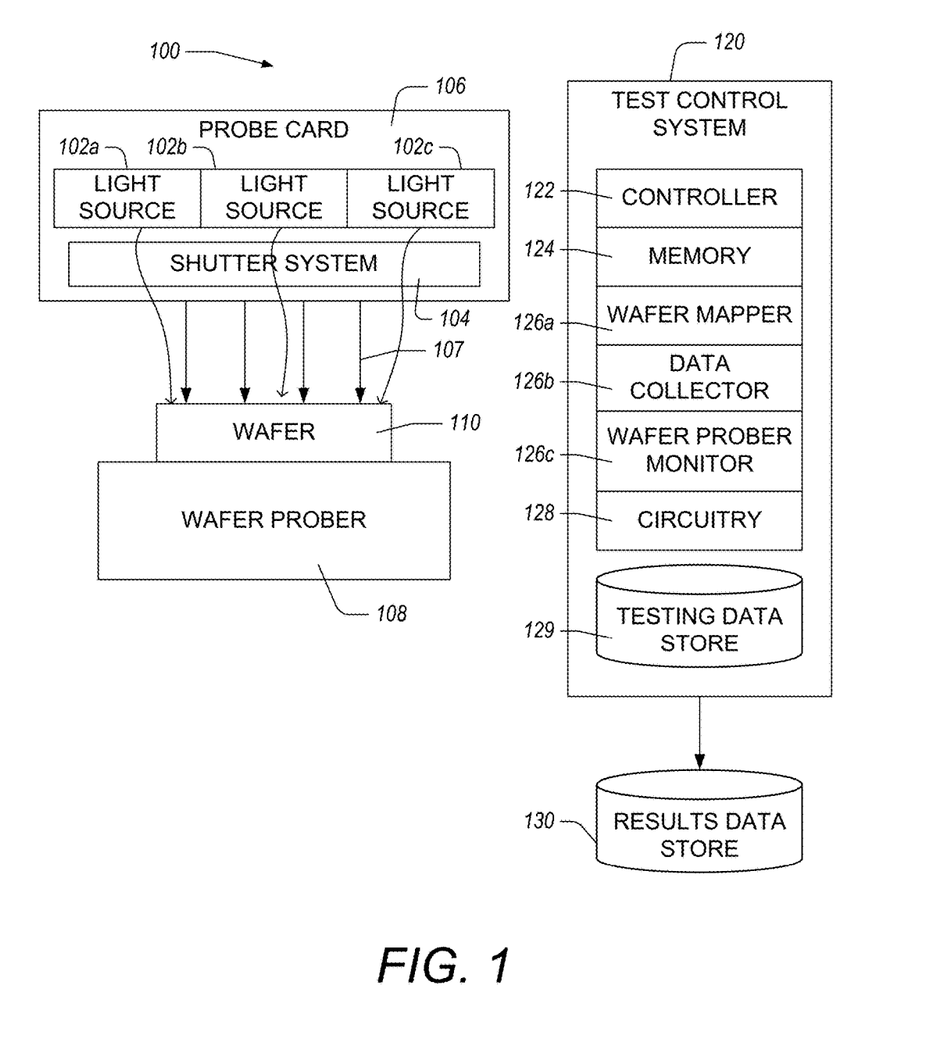
FIG. 1 illustrates a functional block diagram of an example test system configured to perform electronic and radiometric tests that operate at the level of a wafer prober, the tests being performed on a wafer with a large number of FPAs.

FIG. 1 illustrates a functional block diagram of an example test system 100 configured to perform electronic and radiometric tests that operate at the level of a wafer prober 108, the tests being performed on a wafer 110 with a large number of FPAs. The test system 100 can be configured to test all die on the wafer 110 using simultaneous exposure to radiation and controlled variable ambient temperatures. Thus, the test system 100 can be configured to perform the electrical and radiometric testing at the wafer level, prior to dicing. Advantageously, this can provide savings in both time and cost. For example, individual FPAs can be characterized and grouped based at least in part on performance. This can allow the FPAs to be used in a variety of applications requiring different levels of quality of FPA. Such an approach allows the use of one FPA design to be utilized for a variety of performance level imaging systems. For example, in applications where high quality imaging is desirable, FPAs with a large number of operable, high-response pixels may be required. For FPAs intended for lower performance use, e.g., systems with smaller displays or low spatial/temperature resolution requirements, FPAs with lower numbers of operable pixels may be used by conglomerating pixels into groups, for example averaging groups of four pixels into one turns a 32,000 pixel array into an 8,000 pixel array. Such an approach allows for one FPA design to be used for a variety of applications and improves yield by increasing the number of usable arrays for each wafer. Identifying and classifying different levels of FAP performance at the wafer level significantly reduces overall manufacturing costs.

As another example, testing at the wafer level can provide prompt and timely feedback on FPA performance useful for quality control in manufacturing. As another example, calibration data can be made available to an assembly factory before the dies arrive. As another example, dies passing acceptance criteria can be cut and made available to the assembly factory while dies that do not pass the acceptance criteria can be discarded without being cut and/or being made available to the assembly factory.

The test system 100 can be configured for scalability such that testing capacity scales to accommodate production capacity and/or production requests. For example, the test system 100 can be configured so that individual tests or test elements can be independent from one another. In some embodiments, the test system 100 can be configured to operate with independent test elements or test processes with minor modifications to mechanical testing fixtures between tests or between batches of produced wafers. By way of example, an estimated total number of dies per wafer (e.g., for an 8" wafer) may be about 1500-1700 dies per wafer. In some embodiments, the test system 100 can be configured to test about 18,000 dies per 8 hours of operation. As probing all dies in the wafer could be a bottleneck for the entire manufacturing process, the test system 100 can be configured to test multiple dies at a time to improve manufacturing throughput. To increase testing capacity, multiple test systems 100 can be installed at a manufacturing plant.

During the wafer-level tests, the test system 100 can be configured to produce at least two sets of data. For example, the test system 100 can produce simple test data (e.g., results from the various tests) and wafer map data (e.g., characterization of dies on a wafer and/or characterization of pixels within an individual FPA). This data can be carried with an individual die (e.g., by associating test results to a unique die ID) for die mounting (e.g., pick and place) in a PCB assembly house, for example. The test data can be analyzed to detect good and/or bad dies, to collect pixel compensation data (e.g., resistor network settings, adjustable resistor settings, reference resistor network settings, bad column data, etc.), to detect defective dies, to generate wafer maps, and the like. Tests performed by the test system 100 can be judged according to performance criteria. For example and without limitation, performance criteria can include pixel uniformity (e.g., standard deviation and mean of pixel noise), numbers of dead pixels, average response to radiation from an infrared emitter (e.g., standard deviation and mean of pixel response), standard deviation of resistor network settings, and the like.

The test system 100 can be configured to calibrate individual FPAs using reference targets of differing temperature, e.g., relatively cold and hot reference targets (e.g., IR emitters 102a, 102b). In some embodiments, the hot and cold reference targets can be provided by a single IR emitter set to different temperatures. The test system 100 can be configured to use the calibration data to set gain and offset values for individual FPAs using the cold and hot reference targets. The test system 100 exposes the wafer(s) 110 being tested to an IR radiation scene, that is substantially uniform in temperature for a given temperature setting of the reference target and receives scene temperature dependent image data for the hot and cold reference targets from the FPAs. The test system 100 receives, for example, scene data for the cold reference target and scene data for the hot reference target. In some implementations, the test system 100 can determine a scene temperature response gradient slope (e.g., using linear regression) using this information. The test system 100 can be configured to conduct precise gain and offset compensation during this portion of the test process. In some embodiments, the hot reference target can be an IR emitter comprising a metal target coupled to a thermoelectric cooler (TEC) controlled to set the temperature of the metal to be substantially uniform over the surface of the metal, with the temperature being about 40° C. Similarly, in some embodiments, the cold reference target can be an IR emitter comprising a TEC-controlled metal target set at about 24° C. In any case, the target is preferably configured to present a uniform scene to the entire wafer or to at least the entire field of view of the die being tested at a given time. In the second case, the target could be movable along with the prober to follow the die being tested.

The test system 100 can be configured to calibrate individual FPAs using a reference IR target image 102c. The test system 100 can be configured to use the reference IR target image to check the resolution of an individual FPA, for example. To do so, the test system 100 exposes the wafer(s) 110 being tested to the reference IR target image and receives associated image data from the units under test. The test system 100 can be configured to compare the image data to the known reference IR target image to determine the resolution of the unit being tested. The test system 100 can be configured to use test data to detect out-of-range FPAs and/or misbehaving pixels within an individual FPA. The test data can also be used to determine alignment of optical components, behavior of readout electronic circuitry, and the like. In some implementations, the test system 100 can use the image data of the reference IR target image to determine an alignment slope (e.g., using linear regression), a minimal resolution detectable, and the like.

The test system 100 includes reference emitters 102a, 102b, 102c, a shutter system 104, a probe card 106, wafer prober 108 and a test control system 120. The test system 100 is configured to use these components to test the wafer 110 comprising a plurality of dies. The test control system 120 can be configured to control the reference emitters 102a, 102b, 102c; to control the wafer prober 108 coupled to the wafer 110; to receive test data from the probe card 106, which is electrically coupled to the wafer 110 through a plurality of probes 107; to analyze the test data to generate test results, such as a wafer map; and to transmit the test results to a results data store 130.

The wafer prober 108 may include various mechanisms to transport, position, align, and/or otherwise place one or more wafers 110 in appropriate positions for testing. The wafer prober 108 can include the probe card 106 having electrical leads or probes 107 in a pattern that corresponds to electrical contact points on one or more FPAs on the wafer 110 to be tested. When testing is performed, the probes 107 of probe card 106 are brought into contact with the corresponding pads of the one or more FPAs under test, so that various test signals may be transmitted to and from the FPAs on the wafer 110.

In combination, the test control system 120 and the probe card 106 can be adapted to generate test signals to test components of the one or more FPAs on the wafer 110, to analyze output signals, and/or to perform other test operations. The test control system 120 can include a controller 122, memory 124, processing components 126a, 126b, 126c, and/or other circuitry 128. A testing data store 129 may store software instructions and/or data that may be executed and/or utilized by the controller 122 to control and/or coordinate testing of the FPAs on the wafer 110. The test control system 120 includes the main controller 122 that can be separate or integrated with the wafer prober 108, the main controller 122 configured to control the probe card 108. The processing components 126a, 126b, 126c can be variously configured to perform wafer map data collection from the wafer prober 108, to analyze collected data, to upload data to the data store 130, to control the light sources 102a-102c, and the like. In various embodiments, one or more portions of the test system 120 and/or testing data store 129 may be located remotely from the wafer prober 108.

The probe card 106, in certain implementations, includes digital to analog converters, analog to digital converters, DC to DC converters, and the like to interface with and/or to control behavior of FPAs under test on the wafer 110. In certain implementations, the probe card 106 includes a low voltage differential signal driver, a signal level shifter, an I2C D/A converter, an I2C A/D converter, a DC/DC converter, a reference IR target control circuit (that may be configured to control the shutter system 104), a DAC circuit with the IR emitter(s) 102a, 102b, 102c wherein the components of the probe card 106 can be controlled by the test control system 120. In some implementations, the test control system 120 can control the probe card 106 to interface with the wafer 110 and to provide signals to access the analog-to-digital converters on a die, to interact with programmable fuses, to provide digital words or commands to a processor on an FPA, etc.

The test system 100 includes light sources 102a, 102b, 102c. For infrared FPAs, the light sources can be IR sources. As an example, a light source 102a, 102b can be a reference IR source configured to provide a substantially uniform intensity across a surface of the portions of the wafer 110 being tested. In certain implementations, the light source 102a, 102b may not be a Lambertian surface, in which case a zoned analysis can be used during testing. In certain implementations, the light source 102a, 102b can be positioned to provide sufficient working distance to achieve substantially uniformly flat intensity at the wafer 110. In various implementations, the light source 102a, 102b can include a diffuser (e.g., an IR diffuser) with a band pass filter (e.g., an IR band pass filter). In some implementations, the test system 100 can include a thermal source with a flat blackbody spectrum that covers an aperture of the probe card 106.

The test system 100 can include the shutter system 104 configured to selectively occlude the light sources 102a, 102b, 102c. This can be done to provide a substantially stable intensity of light at the wafer 110. For example, a typical IR emitter has a warm-up time, so a shutter can be used to reduce or minimize thermal drift effects associated with this warm-up time. For example, during periods of changing temperature, the shutter can occlude the IR emitter and can unblock the IR emitter when stable operation conditions are achieved. In certain implementations, a current monitor or feedback controller can be used to control power to the light source 102a, 102b, 102c to compensate or otherwise account for ambient temperatures.

The wafer prober 106 can be configured to test various operations of many individual wafer-level packaged FPAs fabricated on a wafer. Using a plurality of radiation sources 102a-102c and electrical probes 107, the wafer prober 108 may selectively provide different temperatures (e.g., wavelengths of electromagnetic radiation), so that responsivity and/or other operational parameters of the FPAs on the wafer 110 can be tested prior to dicing. The wafer prober 108 and associated probe card 108 can be configured to provide substantially uniform illumination over the one or more FPAs on the wafer 110, such that all pixels (e.g., microbolometers, photo detectors, or other sensor elements) of the one or more imaging sensor devices on a common wafer or multiple wafers may be illuminated at the same time (e.g., simultaneously) for testing in an accurate and repeatable manner.

In some embodiments, the light sources 102a-102c can be configured to provide illumination to FPAs so that various operations of the imaging devices or sensors may be tested and/or calibrated by monitoring (e.g., using probes 107 and the test control system 120) various outputs of the imaging devices in response to the illumination provided. As described elsewhere herein, light sources 102a, 102b, 102c may be implemented using infrared (IR) radiation sources to emit IR radiation having desired intensity levels (e.g., flux) and/or wavelengths. For example, in some embodiments, light sources 102a-102c may be implemented using light-emitting diodes (LEDs) or incandescent lamps adapted to emit IR radiation in desired intensity levels and/or wavelengths. In various embodiments, light sources 102a-102c may be black bodies heated to appropriate temperatures to emit IR radiation having desired intensity levels and/or wavelengths.

The operations of the FPAs on the wafer 110 that may be tested include, in some embodiments, a responsivity of the FPA. That is, the wafer prober 108 may be adapted to test changes in the FPAs' electrical output in response to changes in incident flux (e.g., intensity of incident light or radiation). In this regard, light sources 102a-102c may each be adapted to emit radiation having a different level of intensity (e.g., generating a different amount of flux), so that a responsivity of the imaging devices or sensors may be tested by switching among light sources 102a-102c to change incident flux to different levels with accuracy and repeatability. For thermal imaging photodetectors, such as microbolometers, the intensity response of the photodetector is dependent on the temperature of the blackbody source.

In various embodiments, the test control system 120 may be adapted to generate control signals to coordinate various operations of the probe card 108 described herein with various testing operations. For example, in some embodiments, such control signals may be generated by the controller 122 executing software instructions stored in memory 124, and/or further processed by processing components 126a-126c for transmission to the probe card 108.

In various embodiments, such control signals may be transmitted to the shutter system 104 and/or light sources 102a-102c via communication links. In some embodiments, a hub device may be utilized to expand the number of communication links and/or manage multiple communication links. In some embodiments, converter devices may be utilized to convert control signals from the test system 120 into formats, standards, or protocols utilized by various components of the probe card 106 (e.g., between Universal Serial Bus (USB) and RS-232 or RS-422, in some embodiments). The hub device 1004 and/or converter devices 1006A-1006C may permit the test system 120 to utilize a unified format, standard, or protocol for control signals, and thus may reduce complexity. In various embodiments, the test system 120 may encode control signals according to a standard protocol.

In some embodiments, subsequent to electrical testing of dies on the wafer 110, the test system 120 can perform a calibration test. The calibration test can benefit from being in a temperature-controlled, dust-free and emission limited environment, conditions that can be present during the testing described herein.

Figure 2A:
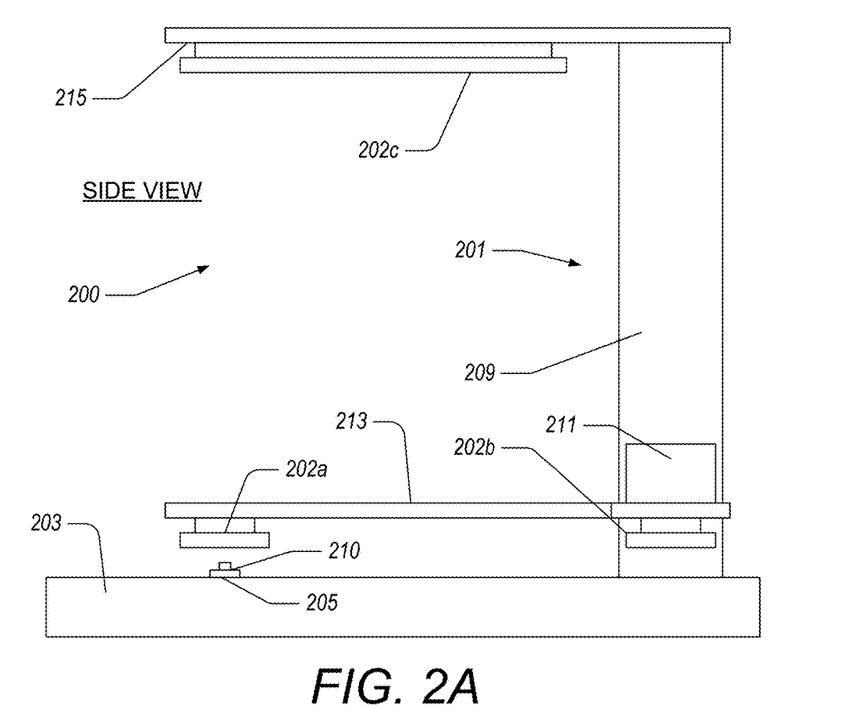
FIGS. 2A illustrates an example test fixture structure of a test system.
Figure 2B:
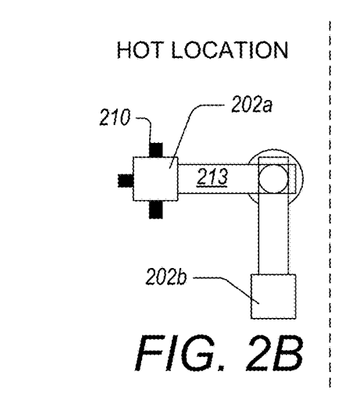
FIGS. 2B-2D illustrate configurations of the example test fixture to selectively expose a tested focal plane array to infrared radiation.
Figure 2C:
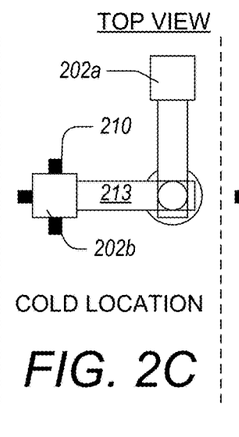
Figure 2D:
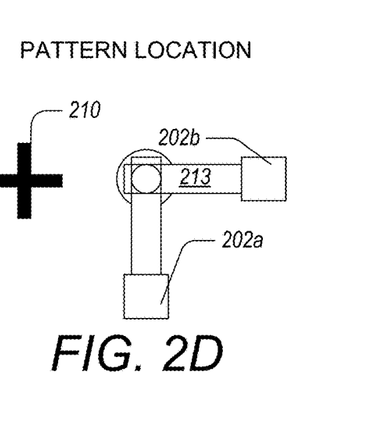

FIG. 2A illustrates an example test fixture 201 structure of a test system 200. The test fixture 201 includes a base plate 203 with a bed-of-nails component 205 configured to electrically couple to the wafer 210 under test. The base plate 203 provides support for an illumination apparatus 209 that in turn supports three light sources 202a, 202b, and 202c. The illumination apparatus 209 can include a motor 211 configured to rotate a lower support 213 of the illumination apparatus 209 to position the light sources 202a, 202b for various testing phases. For example, in a first configuration (illustrated in FIG. 2B), the light source 202a is positioned above the wafer 210 being tested with the light source 202b configured away from the wafer 210. Similarly, in a second configuration (illustrated in FIG. 2C), the light source 202b is positioned above the wafer 210 being tested with the light source 202a positioned away from the wafer 210. In a third configuration, illustrated in FIG. 2D, the motor 211 rotates the lower support 213 so that the light sources 202a, 202b are not above the wafer 210, exposing the wafer 210 to the light source 202c mounted on an upper support 215 of the test system 200.

Figure 3:
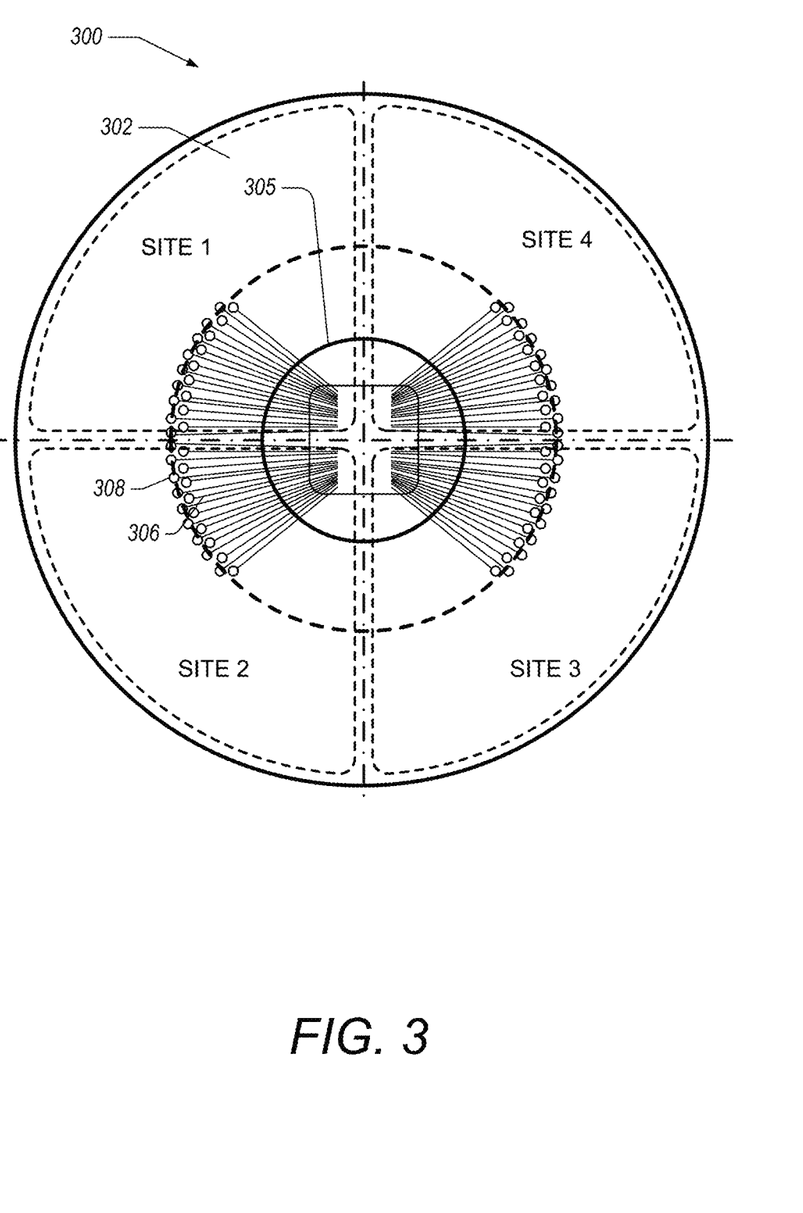
FIG. 3 illustrates an example probe card configured to test 4 dies simultaneously.

FIG. 3 illustrates an example probe card 300 configured to test 4 dies simultaneously, with die probe contact pads on the detector side of the wafer. The probe card 300 includes a circuit board 302 having a main aperture 305 configured to expose dies on a wafer for testing. The probe card 300 includes multiple probes 306 electrically coupled to leads 308 on the circuit board 302, the probes extending from the leads 308 through the aperture to contact corresponding pads on the dies on the wafer for testing. In use, the wafer and probe card 300 are relatively positioned so as to bring the probes 306 into contact with corresponding pads on the dies and to position the dies under the main aperture 305 to receive light provided through the main aperture 305 for testing. The probe card 300 can be coupled to a control system and a data acquisition system, such as the test control system 120 described herein with reference to FIG. 1. The control system and data acquisition system can be fully automated as well as the positioning of the dies and probe card, such as within a wafer prober like the wafer prober 108 described herein with reference to FIG. 1.

By way of example, a die can comprise a bolometer having 18 pads per die. The probe card 300 can be configured to have a total of 72 probes 306. During testing, each bolometer can be electrically coupled to the probe card 300 through the probes 306. In certain implementations, the dies being tested can be configured to generate about 150 frames at about 25 Hz for a die test, which can take about 6 seconds total including the process of turning on and stabilization of the light sources as well as uploading data to a master controller.

Figure 4A:
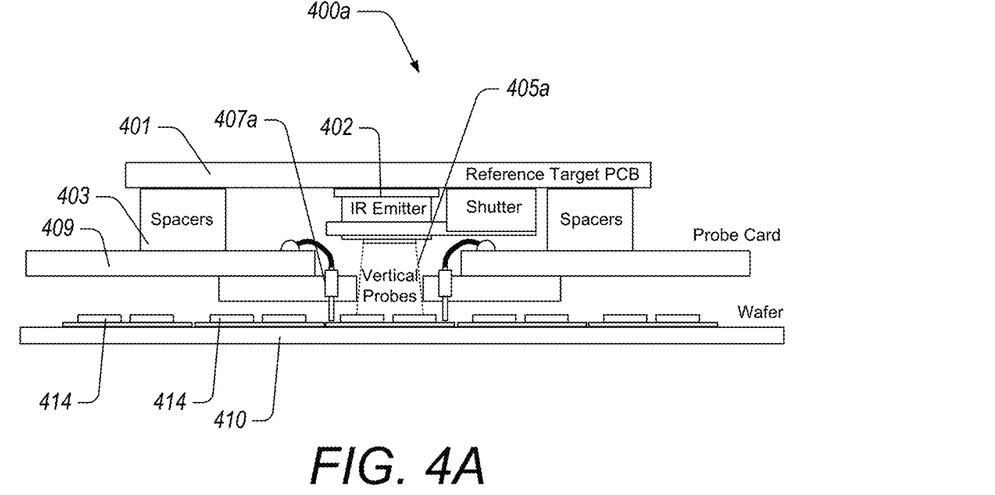
FIGS. 4A and 4B illustrate example configurations of a probe card in use testing dies on a wafer.
Figure 4B:
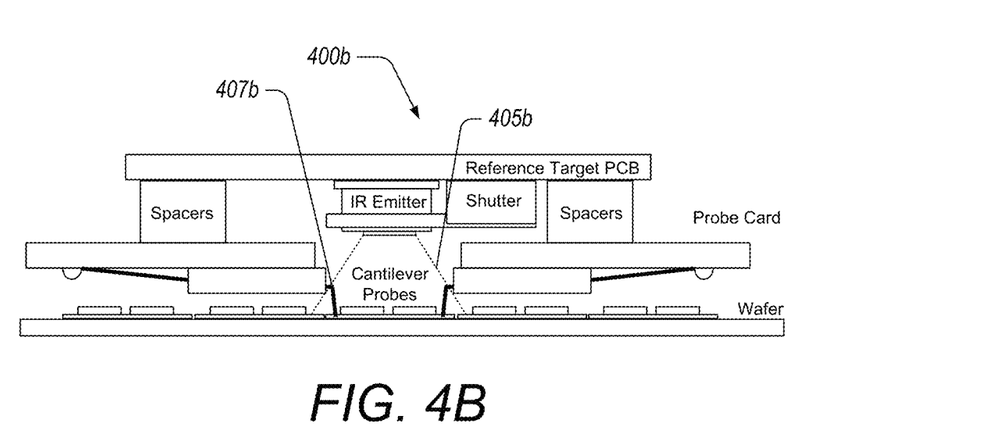

FIGS. 4A and 4B illustrate example configurations of a probe card 400a, 400b in use testing dies 414 on a wafer 410. In FIG. 4A, an example of the probe card 400a is illustrated, the probe card 400a having vertical probes 407a configured to contact electrical pads on the dies 414. In FIG. 4B, an example of the probe card 400b is illustrated, the probe card 400b having cantilevered probes 407b configured to contact electrical pads on the dies 414. The probe card 400b has an aperture 405b that is larger than the aperture 405a for the probe card 400a.

The probe cards 400a, 400b include a reference target printed circuit board 401 configured to support and electrically couple a shutter system 404 and a light source 402. The probe cards 400a, 400b include spacers 403 configured to mechanically couple the reference target printed circuit board 401 to probe printed circuit boards 409. The probe printed circuit boards 409 are configured to form the apertures 405a, 405b and to mechanically support the probes 407a, 407b. The probe printed circuit boards 409 are further configured to electrically couple to the probes 407a, 407b.

As illustrated, the example probe cards 400a, 400b can be configure to test at least four dies simultaneously. In the center of the probe cards 400a, 400b, a reference IR emitter 402 can be installed to excite a bolometer under test. The probes 407a, 407b can be used to receive signals from the excited bolometers. This data can be used, for example, for resistor network calculations and calibration.

As illustrated, the reference. IR emitter 402 can be installed in a separate printed circuit board 401 on the top of probe card 400a, 400b to excite at least four dies concurrently. Typically, cantilever type probe card 400b has more space to accommodate installation of an IR emitter than the vertical type probe card 400a.

The probe cards 400a, 400b can be configured to incorporate at least 4 electronic circuit systems for functional testing of dies. The probe cards 400a, 400b can be configured to interface with the test system, e.g., through a master controller. In some embodiments, the master controller can be installed on top of the wafer prober through robust communication hardware. In certain implementations, built-in pogo pins may be used to interface with the master controller.

Figure 5:
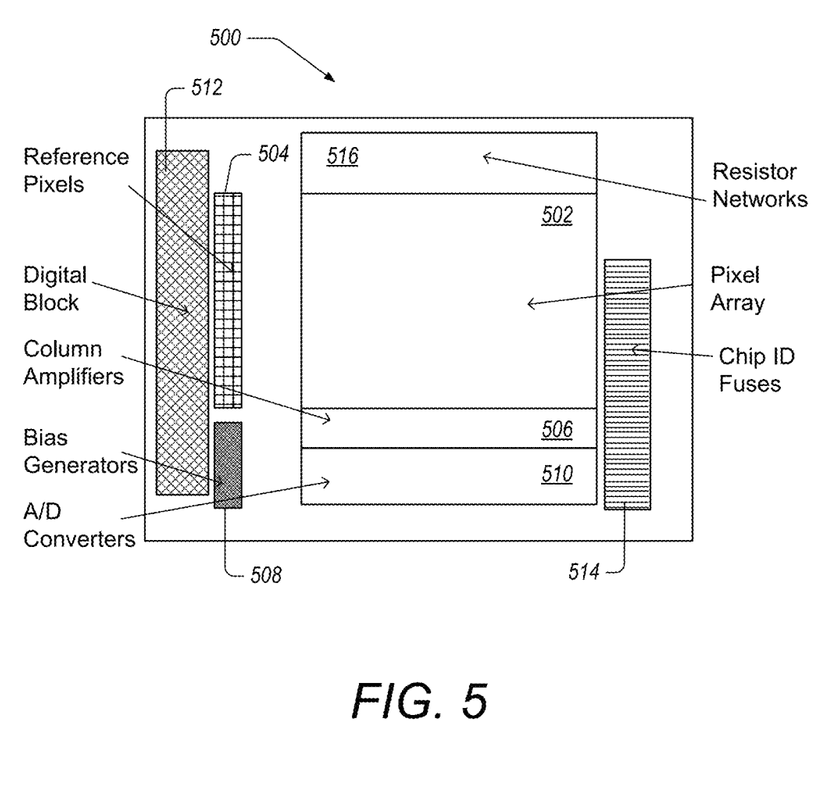
FIG. 5 illustrates an example of a layout of an individual die on a wafer.

FIG. 5 illustrates an example of a layout of an individual die 500 on a wafer. The die 500 includes an array of pixels 502 (e.g., a 206×156 array of 12 μm pixels). The die 500 includes reference columns 504 comprising a plurality of pixels in each column, column amplifiers 506, bias generators 508, analog to digital converters 510, a digital block 512, chip identification fuses 514, and resistor network pixel adjusts 516. The chip identification fuses 514 can be configured to encode a unique identifier for each die. This unique identifier can be used to track test results and to associate the test results with a particular die 500. The reference columns 504 can be configured to be shielded from a scene when in use in a thermal imaging system. The signals of the pixels in the reference columns 504, then, correspond to signals of infrared radiation at a temperature of the FPA within the operational environment.

Imaging FPA response, particularly for many types of thermal sensors, such as microbolometers, is not only dependent on scene temperature but also on ambient temperature, as the response of microbolometers, and other photodetectors as well, shifts with the temperature of the detector. The wafer chuck may include or be a part of a temperature controlled base that can keep the entire wafer at a controlled temperature, and this temperature can be changed to accomplish die testing at varying ambient temperatures. Thus all die to be tested can be done at various controlled ambient temperatures that only can be changed after all or many of the die on the wafer are finished at each ambient setting. This greatly reduces ambient temperature settling on a per die basis.

Example Test Flow

Electrical and radiometric tests can be performed on a plurality of die simultaneously to decrease the amount of time and cost associated with characterizing and testing wafer level devices such as FPAs. For ease of description, the tests disclosed herein are described as being performed by a test system and/or a test control system, such as the test system 100 and/or the test control system 120 described herein with reference to FIG. 1. However, the tests can be performed using individual components of the test system 100 or combinations of components. For example, one or more components can be used to perform an individual test while other combinations of components can be used to perform another test. Accordingly, the following descriptions of tests and the related components are not intended to imply that the tests are required to be performed by the identified components. A person of ordinary skill in the art will recognize that there are alternative structures and/or components capable of performing the same or similar tests as described herein and the disclosure is intended to extend to these variations.

As a first step in testing, dies on a wafer can be probed and tested for electrical performance For example, the die can be tested to identify internal shorts. The test system can apply voltages on one or more probes and measure voltages at different probes to identify expected or acceptable voltage drops across electrical components and to identify where measurements deviate from expectation. The test control system can be configured to identify the acceptable and unacceptable measurements and to flag had electrical components, to identify a bad die, and/or to aggregate test results to characterize individual dies.

After initial electrical testing, the following tests can be conducted per die on the wafer: basic communication, power consumption, fuse programming, ramp adjustment or global pre-amp bias, reference pixel tests, bolometer tests, ADC testing, resistor network balancing for columns in the FPA, global resistance tests, integrator tests, resistor network normalization, pixel noise characterization, and/or pixel gain measurements. Each of the above tests can be performed individually and/or as part of a test procedure to fully test a particular die. One or more of the tests described herein can be excluded from a particular test procedure without departing from the scope of the disclosed embodiments.

To test basic communication for the die, the test system can be configured to use a probe card to send and receive data to the die. If the test control system establishes that the die has received the data and/or has replied as expected or has provided an acceptable reply, the test control system can determine that the die has passed the basic communication test. If not, the test control system can flag this test as being failed for the die. Depending at least in part on the test that is failed, the test system 100 can flag a die as being unacceptable. For example, if a die cannot pass the basic communication test, the test system can flag the die as being unacceptable for use in an imaging system.

To test power consumption of the die, the test system can provide power to selected probes. The test system can measure voltages at selected probes to determine that selected parts consume an acceptable amount of power. By way of example, a plurality of power supplies can be energized and measurements can be made to verify each power supply voltage is being received and that voltage points within the die have voltages within acceptable ranges. In some implementations, the power consumption test can be performed for about 4 frames of acquisition of the FPA on the die (e.g., 4 frames of a 25 Hz FPA, or this individual test can last about 160 ms).

To program the chip ID fuses on the die, as described herein with reference to FIG. 5, the test system can create a unique identification for each die. This chip identification can be encoded using the programmable fuses on the die. This can be an important step during the testing process because it allows calibration and testing data to be stored in a location other than on the chip. When this information is to be used, the chip ID can be read from the chip and the appropriate calibration or testing data can be retrieved based on this unique chip ID. To program the chip ID, the test control system can control the probe card to write to an appropriate register, burn selected fuses for the chip ID, and then verify that the correct ID has been encoded by the selected burned fuses. In some embodiments, the chip ID can be encoded using 48 fuse circuits.

By assigning a unique identifier at the testing stage rather than the fabrication stage, fewer identification numbers can be created and tracked because not all manufactured wafers or dies are tested due to early failures or for other reasons making the dies unusable for imaging purposes. This makes the tested dies easier to track. In some embodiments, this test can be performed over about 1 frame of the FPA.

To test the global pre-amp bias, ramp voltages can be adjusted and resulting signals can be characterized as a function of ramp voltage. In some embodiments, the ramp voltages can be adjusted over about 1.6 V. In some embodiments, this test can be performed over about 8 frames of the FPA.

To test reference columns, the test system can apply voltages to the die and probe voltage rail values to determine whether the values are within acceptable ranges. If a column does not measure within the acceptable range, it can be included in a list of unacceptable columns. The test control system can be configured to generate a reference de-select map indicating which columns in the portion of the reference columns on the die should not be used. Where there are multiple columns, one or more columns may be determined to fail this test without causing the die to be classified as a bad die. The reference de-select map can be used by an imaging system, for example, to avoid using bad reference columns This can increase the yield of acceptable FPAs due at least in part to being able to have one or more bad reference columns while still being able to perform suitably for use in imaging applications. In some embodiments, this test can be configured to last for about 17 frames of an FPA.

The test system can be configured to test a selected bolometer on the FPA. In this test, an individual bolometer can be sampled to indicate a die's infrared performance. This information can be used to provide an indication of die performance on a wafer and/or as an indication of wafer quality. To perform the test, the test control system can apply selected voltages to the selected bolometer and read voltages from the bolometer. The test control system can calculate a thermal constant, conductivity, and thermal capacity of the selected bolometer based on the applied and measured voltages. The results of this test can be used by the test control system to identify potentially bad dies and/or potentially bad wafers. In some embodiments, the selected bolometer can be a bolometer that is separate from the array of pixels in the FPA, or a bolometer specifically designed for this test. Accordingly, this can be a fast screening mechanism to detect bad wafers and/or bad dies, increasing test throughput by identifying early and quickly bad wafers or dies. In some embodiments, this test can be performed for 1 frame of an FPA.

The test system can be configured to test the ADCs that are on the die, as described herein with reference to FIG. 5. For example, different voltage levels can be applied to the ADCs to measure the output of the ADCs and compare the measured number of digital counts to an acceptable range. If the output counts from the ADCs are within the acceptable range, the ADC can be said to have passed the test. As a particular example, an ADC can be sampled at 2 voltages to determine the output at those voltages. In some embodiments, the test system can be configured to determine a slope and offset to characterize the performance of the ADC using measurements at the 2 applied voltages. As another example, discrete voltage steps can be applied to the ADC where a higher voltage is applied to step through a high gain channel to get a value under a threshold of the high gain channel, and a lower voltage can be stepped through to determine a transition value from the high gain channel to the low gain channel. In some embodiments, this test can be performed over 16 frames of an FPA.

The test system can be configured to perform resistor network balancing of the FPA. For example, a resistor network can be associated with an individual column of the FPA. For each resistor network associated with a column, the resistance values can be balanced so that each column is within a particular range. For example, a tailored input can be applied and this input can be clamped, and a global resistor value can be set. The test control system can then be used to adjust the resistor network threshold to find the threshold where the columns are substantially or approximately balanced. In some embodiments, bad columns can be identified where the test control system cannot achieve suitable resistor network settings to balance the individual column. In some embodiments, this test can be performed over 9 frames of an FPA.

The test system can be configured to perform global resistance testing to determine a value for a global resistor for the FPA. By way of example, the test control system can alter a value of an adjustable coarse gain resistor over a plurality of steps (e.g., 8steps). The value of the resistances and the span of resistance values can be selected to mimic or simulate a desirable temperature span over which the FPA can be expected to operate. At each resistance setting, measurements can be made for columns in the FPA. The resistance values and recorded column measurements can be stored as calibration data. In some embodiments, this test can be performed over 9 frames of an FPA.

The test system can be configured to test the reference columns on the die, such as the reference columns described herein with reference to FIG. 5. In some embodiments, each die can include a plurality of reference columns (e.g., 16 reference columns) and a subset of these can be used in operation of the FPA. This test can be done to determine which of the columns are acceptable or well-suited for use during operation in an imaging system. The test control system can be configured to determine performance properties of each of the reference columns In some embodiments, the least noisy reference columns, relative to all the reference columns, can be used in operation. In some embodiments, reference columns can be determined to be bad columns if they are outside acceptable operating ranges (e.g., unacceptable electrical noise, pixel response, etc.). In certain implementations, if there are not a sufficient number of acceptable reference columns, the die can be determined to be a bad die. To test the reference columns, the test control system can adjust resistor network values for reference columns using a plurality of global resistance settings. Measurements of noise within the reference columns can be made to characterize the reference columns at each setting of resistor network value and global resistance value. In some embodiments, this test can be performed over 8 frames of an FPA.

The test system can be configured to test integrators associated with columns on the FPA. For example, the test control system can be configured to set a global resistance value to a relatively large value, to set a resistor network value (e.g., for an individual bolometer) to a value near a mid-point of its operating range, and to measure ADC values from the bolometers. These measured values can be used as estimates of a zero level for subsequent resistor network calculations. In some embodiments, this test can be performed over 2 frames of an FPA.

The test system can be configured to normalize resistor network settings for a plurality of global resistance settings. For example, for individual global resistor settings configured to correspond to a particular temperature range in operation, the test control system can be configured to normalize the resistor network values of the reference columns and to normalize the resistor network values of the array of pixels to achieve a targeted response for pixels in the FPA. The test control system can be configured to collect cold frame data (e.g., image data from the FPA when exposed to a cold IR emitter, as described herein) and to determine noise of pixels. The test control system can be configured to determine resistor network values within an acceptable range for operation of the FPA. These values can be used as initial settings or calibration values for use in an imaging system. This test can also be used to alter and/or to determine values for electrical components within the die to achieve targeted performance characteristics (e.g., targeted response to scene temperatures within a temperature range, targeted noise performance, etc.). In some embodiments, this test can be performed over 8 frames of an FPA.

The test system can be configured to characterize pixel noise within the FPA. The test control system can be configured to turn light sources off and to acquire measurements from the pixels. The acquired data can be analyzed to determine the noise on each pixel. In some embodiments, this test can be performed over 17 frames of an FPA.

The test system can be configured to characterize pixel gain within the FPA. The test control system can be configured to turn off light sources, to acquire images with no incident light from the light source, to turn on a light source, to acquire images with incident light form the light source, and to determine average pixel values for images after finding a difference between the image data acquired with the light source on and the light source off. This information can be used to determine pixel gains and to generate gain tables by performing these tests using various global resistor settings (e.g., mimicking different temperatures). This test can also be used to identify bad pixels within the array. In some embodiments, this test can be performed over 16 frames of an FPA. A pixel may be bad if adjustment of the resistor networks within a tailored range cannot bring a pixel response to a given scene temperature to within an acceptable threshold range.

The test control system can be configured to perform a test for each position within a wafer prober to achieve high throughput for testing. For example, the test control system can be configured to step through a plurality of global resistance values. For each global resistance value, the test control system can be configured to normalize reference resistor network values, normalize pixel resistor network values within the array, collect noise statistics, and to collect dark image data (e.g., image data with no IR emitter enabled). The test control system can then enable an IR emitter and collect controlled scene temperature image data (e.g., image data with an IR emitter enabled), flag bad pixels, and generate a gain table.

The test control system can be configured to grade or classify pixels within a die. For example, a pixel can be flagged as bad if its resistor is outside high or low limits, is past a noise threshold, has a gain that is outside 25% of the array's mean response, or the like. The test control system can be further configured to grade FPAs based at least in part on performance of the pixels, reference columns, and the like within the FPA. This allows FPAs to be classified and used in different applications. For example, an application may use only a subset of pixels available on a die, and dies can be identified which fulfill this requirement. For example, an imager may use 8,000 pixels where 32,000 pixels may be available on an FPA. If an FPA has good pixels distributed in a way to be able to generate about 8,000 pixels values through signal processing techniques, then the FPA can be classified by the test control system as suitable for use in the particular application.

In some embodiments, the test system can generate calibration data for individual FPAs. For example, calibration data for a global resistor on an FPA can include a default command word, a table of resistance values for resistor networks on the focal plane array, a table of voltages, and a gain table for pixels with bad pixels marked as having a gain value of zero, and the like.

Figure 6:
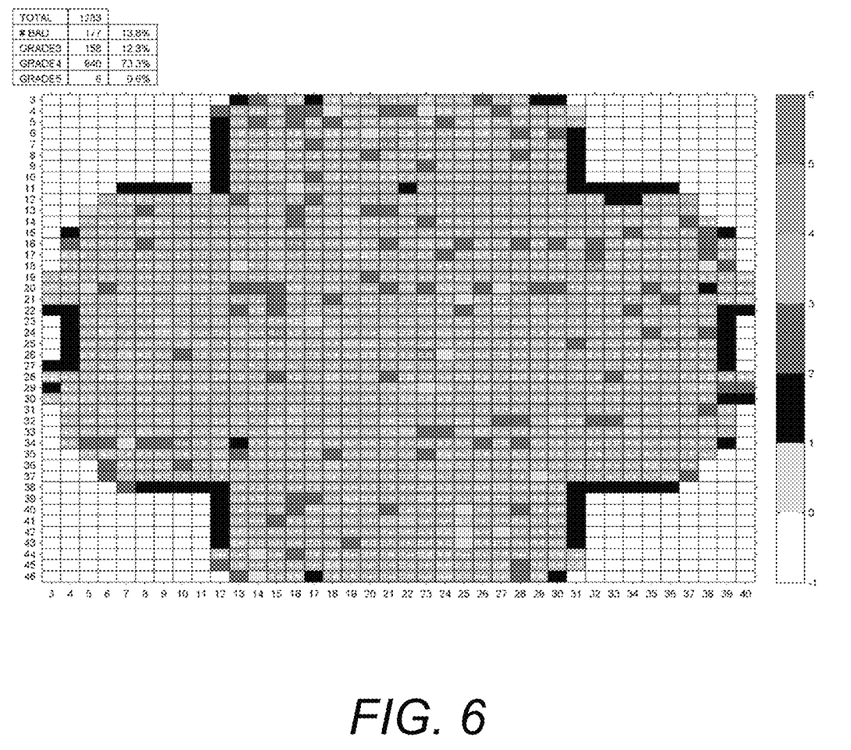
FIG. 6 illustrates an example wafer map.

The test control system can be configured to generate a wafer map, identifying bad dies within a wafer. An example wafer map is illustrated in FIG. 6. This wafer map illustrates different classifications of dies within a wafer, as described herein. Different classifications of dies can be used in different applications. High quality dies can be used, for example, in applications requiring high precision and high performance, whereas lower quality dies can be used in less precise or less demanding applications.

Some or all of these operations, other than the id fusing, can be repeated at different ambient temperatures of the wafer as described above.

Much of the data collected can be used by the processors that control the FPA when it is integrated into a thermal imaging system such as for example a thermal camera. For instance, in an exemplary system, the FPA die can be mounted onto a PCB that also contains a processor and memory. In some cases the onboard processor is also the system controller. In some other cases the board is packaged, and in use the camera may be plugged into a system controller wherein display and control functions are shared between the onboard controller and the system controller. In some cases the system controller and display may be a Personal Electronic Device (PED) and the thermal camera may be a plug-in accessory. Both the onboard processor and the system processor can utilize the results of the wafer-level testing described herein to operate, to set the various parameters and to perform image processing and display. As described elsewhere herein, a results data store can store each die's test data in a file identified by the die identification, which may in some cases be permanently set by the ID fuses on each die which are configured during wafer testing. When the FPA is integrated with the PCB and the board is tested, the ID is read for the die and the firmware and memory on the onboard processor, or alternatively the system controller, can be loaded with the data file for that die. This data file can include data utilized both by the onboard processor and by the system controller. The first time the camera is interfaced with a system controller, for example, an application running on the controller can provide the data it needs from the onboard storage.

The embodiments described herein are exemplary. Modifications, rearrangements, substitute processes, etc. may be made to these embodiments and still be encompassed within the teachings set forth herein. One or more of the steps, processes, or methods described herein may be carried out by one or more processing and/or digital devices, suitably programmed.

Depending on the embodiment, certain acts, events, or functions of any of the algorithms described herein can be performed in a different sequence, can be added, merged, or left out altogether (e.g., not all described acts or events are necessary for the practice of the algorithm). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. For example, the LUT described herein may be implemented using a discrete memory chip, a portion of memory in a microprocessor, flash, EPROM, or other types of memory.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. A method for simultaneously testing a plurality of focal plane arrays on a wafer, each focal plane array on a die on the wafer, the method comprising:
    applying electrical voltages to a plurality of dies simultaneously using a probe card having a plurality of sets of probes, individual sets of probes configured to electrically couple to electrical pads on corresponding individual dies on the wafer;
    measuring electrical voltages corresponding to the applied electrical voltages to determine the existence of electrical shorts within the dies;
    exposing pixels within the plurality of focal plane arrays to infrared radiation;
    acquiring measurements of pixel responses;
    adjusting a resistance of at least one of an adjustable global resistor or adjustable resistor networks to achieve a targeted response for the pixels, wherein the adjustable global resistor and the adjustable resistor networks are components of individual focal plane arrays;
    generating a pixel quality table indicating pixels that are flagged as good pixels and pixels that are flagged as bad pixels; and
    storing initial adjustment settings for use by an imaging system incorporating one of the plurality of tested focal plane arrays, the initial adjustment settings comprising the adjusted resistance of the adjustable global resistor or the adjustable resistor networks,
    wherein the pixel quality table and the determined initial adjustment settings are saved to a results data store.

2. The method of claim 1 further comprising generating a gain table for pixels in an individual focal plane array based at least in part on the acquired measurements.

3. The method of claim 1, wherein exposing pixels to infrared radiation comprises:
    exposing pixels to an infrared emitter at a first temperature; and exposing pixels to an infrared emitter at a second temperature, hotter than the first temperature.

4. The method of claim 1, wherein a thermal imaging system integrating a tested focal plane array die is configured to retrieve the pixel quality table and the determined initial settings from the results data store.

5. The method of claim 1 further comprising configuring a plurality of fuses on an individual die to encode a die identification.

6. The method of claim 5, wherein the pixel quality table or the determined initial settings for an individual focal plane array are stored in a results data store using the die identification to identify the pixel quality table or the determined initial settings associated with the individual focal plane array.

7. The method of claim 1, wherein a tested focal plane array that has been determined to pass performance criteria is suitable for integration in a thermal imager without further testing.

8. The method of claim 1 further comprising classifying a tested focal plane array based on the acquired measurements and the generated pixel quality table.

9. The method of claim 1 further comprising using the acquired measurements and the generated pixel quality table to provide feedback for a wafer manufacturing process.

10. The method of claim 1 further comprising performing a basic communication test with an individual die being tested.

11. The method of claim 1 further comprising performing a bolometer test configured to sample a particular bolometer on a tested die, wherein the sampled data from the particular bolometer is used as an indication of wafer quality.

12. The method of claim 1 further comprising balancing resistor network values so that columns within an individual focal plane array are substantially balanced.

13. The method of claim 1 further comprising testing reference columns of an individual focal plane array to determine a subset of reference columns that are suitable for use during operation as part of a thermal imaging system.

14. The method of claim 1 further comprising repeating at least 1 of the steps with the wafer at more than one ambient temperature.

15. The method of claim 14 wherein the wafer ambient temperature is controlled by a heater in a wafer chuck holding the wafer.

16. The method of claim 15 wherein the die comprises a temperature sensor, and the temperature is calibrated using reading at the plurality of ambient temperature settings.

* * * * *